(12) United States Patent
Bowlerwell et al.

(10) Patent No.: US 12,719,355 B2
(45) Date of Patent: Aug. 25, 2026

(54) CONTROL OF BOOST CONVERTER CURRENT LIMIT

(71) Applicant: Cirrus Logic International Semiconductor Ltd., Edinburgh (GB)

(72) Inventors: John B. Bowlerwell, Dunfermline (GB); Eric J. King, Austin, TX (US); Alastair M. Boomer, Edinburgh (GB); Malcolm Blyth, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 116 days.

(21) Appl. No.: 18/415,208

(22) Filed: Jan. 17, 2024

(65) Prior Publication Data

US 2024/0266948 A1 Aug. 8, 2024

Related U.S. Application Data

(60) Provisional application No. 63/483,618, filed on Feb. 7, 2023.

(30) Foreign Application Priority Data

Apr. 4, 2023 (GB) .................................... 2305028

(51) Int. Cl.
*H02M 1/00* (2007.01)
*H02M 1/32* (2007.01)
(Continued)

(52) U.S. Cl.
CPC ......... *H02M 1/327* (2021.05); *H02M 1/0009* (2021.05); *H02M 3/156* (2013.01); *H10W 40/00* (2026.01)

(58) Field of Classification Search
CPC ..... G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155;
(Continued)

(56) References Cited

U.S. PATENT DOCUMENTS 6,507,172 B2 * 1/2003 Sherman .................. G06F 1/26 320/128
10,063,058 B2 * 8/2018 Shimada ............ H02M 3/1584
(Continued)

OTHER PUBLICATIONS

Combined Search and Examination Report under Sections 17 and 18(3), UKIPO, Application No. GB2305028.9, mailed Oct. 5, 2023.

*Primary Examiner* — Jeffrey A Gblende
(74) *Attorney, Agent, or Firm* — Jackson Walker L.L.P.

(57) ABSTRACT

A method for controlling an input current limit of boost converter circuitry, the method comprising: receiving a power dissipation value for the boost converter circuitry; and controlling an input current limit of the boost converter circuitry based on the power dissipation value.

21 Claims, 9 Drawing Sheets

(51) Int. Cl.
*H02M 3/156* (2006.01)
*H10W 40/00* (2026.01)

(58) Field of Classification Search
CPC ...... H02M 3/156; H02M 3/157; H02M 3/158; H02M 1/346; H02M 3/1588; H02M 2003/1566; H02M 3/1582; H02M 3/1584; H02M 2003/1557; H02M 1/0032; H02M 1/4225; H02M 7/217; H02M 1/0025; H02M 1/0045; H02M 1/0009; H02M 1/08; H02M 1/088; H02M 1/0048; H05B 39/048; B23K 11/24; H04B 2215/069
See application file for complete search history.

(56) References Cited

U.S. PATENT DOCUMENTS

| | | | | |
|---|---|---|---|---|
| 10,630,194 | B2 * | 4/2020 | Lisaka | H02J 7/06 |
| 2008/0007236 | A1 * | 1/2008 | Elbanhawy | H02M 3/157<br>323/283 |
| 2013/0314067 | A1 | 11/2013 | Matzberger et al. | |
| 2014/0145650 | A1 * | 5/2014 | Li | G05F 5/00<br>318/434 |
| 2018/0076647 | A1 | 3/2018 | Wei et al. | |
| 2018/0109181 | A1 | 4/2018 | King et al. | |

* cited by examiner

CONTROL OF BOOST CONVERTER CURRENT LIMIT

The present disclosure claims priority to U.S. Provisional Patent Application Ser. No. 63/483,618, filed Feb. 7, 2023, and United Kingdom Patent Application No. 2305028.9, filed Apr. 4, 2023, each of which is incorporated by reference herein in its entirety.

FIELD OF THE INVENTION

The present disclosure relates to a system and method for controlling an input current limit of boost converter circuitry.

BACKGROUND

In a packaged integrated circuit (IC) device, circuitry is implemented on a semiconductor (e.g. silicon) die encased in a protective package. The package is provided with external connectors such as conductive pins, pads or balls which are internally coupled to the semiconductor die to permit connection of the semiconductor die to external components.

In operation, power is dissipated by the circuitry, which causes a junction temperature of the semiconductor die to increase. The degree to which the junction temperature increases is dependent upon the junction to ambient thermal resistance Theta JA (ΘJA) of the package. The junction to ambient thermal resistance ΘJA is defined as the temperature differential between a junction of an IC and the ambient temperature per Watt of power dissipated.

SUMMARY

According to a first aspect, the invention provides a method for controlling an input current limit of boost converter circuitry, the method comprising:

- receiving a power dissipation value for the boost converter circuitry; and
- controlling an input current limit of the boost converter circuitry based on the power dissipation value.

The method may further comprise determining the power dissipation value based on an input power value of the boost converter circuitry and an efficiency value for the boost converter circuitry at the determined input power value.

Determining the input power value of the boost converter circuitry may comprise:

- receiving an input current value and an input voltage value and determining the input power value based on the input current value and the input voltage value.

The input current value may be based on a signal received from input current monitor circuitry and the input voltage value may be based on a signal received from input voltage monitor circuitry.

Controlling the input current limit of the boost converter circuitry based on the power dissipation value may comprise:

- comparing the power dissipation value to a threshold power dissipation value; and
- if the power dissipation value exceeds the threshold power dissipation value, reducing the input current limit; and
- if the power dissipation value is equal to or lower than the threshold power dissipation value, maintaining the input current limit at an existing level.

Controlling the input current limit of the boost converter circuitry based on the power dissipation value may comprise:

- determining a change in a junction temperature of a semiconductor die on which the boost converter circuitry is implemented;
- comparing the change in the junction temperature to a threshold temperature change value; and
  - if the change in the junction temperature exceeds the threshold temperature change value, reducing the input current limit; and
  - if the change in the junction temperature is equal to or lower than the threshold temperature change value, maintaining the input current limit at an existing level.

Controlling the input current limit of the boost converter circuitry based on the power dissipation value may comprise:

- determining a final junction temperature value of a semiconductor die on which the boost converter circuitry is implemented resulting from power dissipation;
- comparing the final junction temperature value to a threshold junction temperature value; and
  - if the final junction temperature value exceeds the threshold temperature change value, reducing the input current limit; and
  - if the final junction temperature value is equal to or lower than the threshold junction temperature value, maintaining the input current limit at an existing level.

Controlling the input current limit of the boost converter circuitry based on the power dissipation value may comprise:

- determining a duration for which the boost converter circuitry is permitted to dissipate power at the power dissipation value; and
- controlling the input current limit of the boost converter circuitry based on the determined duration.

Determining the duration for which the boost converter is permitted to dissipate power at the power dissipation value may comprise comparing the power dissipation value to a predefined power dissipation vs duration function.

The efficiency value may be dynamically calculated or dynamically measured during operation of the boost converter circuitry.

The efficiency value may be determined based on a polynomial defining a relationship between an input power of the boost converter circuitry, a boost ratio of the boost converter circuitry and an efficiency of the boost converter circuitry.

The efficiency value may be determined based on a lookup table defining input power values, boost ratio values and corresponding efficiency values for the boost converter circuitry.

The input current limit of the boost converter circuitry may be controlled to limit a die temperature increase or a rate of die temperature increase of a semiconductor die on which the boost converter circuitry is implemented.

According to a second aspect, the invention provides a method for controlling an input current limit of boost converter circuitry, the method comprising:

- receiving a power dissipation value of the boost converter circuitry;
- determining a duration for which the boost converter circuitry is permitted to dissipate power at the power dissipation value; and controlling the input current limit of the boost converter circuitry based on the determined duration.

The method may further comprise:

determining an input power value of the boost converter circuitry;

receiving an efficiency value for the boost converter circuitry at the determined input power value; and determining, based on the efficiency value and the input power value, the power dissipation value for the boost converter.

The efficiency value may be dynamically calculated or dynamically measured during operation of the boost converter circuitry.

The efficiency value may be determined based on a polynomial defining a relationship between an input power of the boost converter circuitry, a boost ratio of the boost converter circuitry and an efficiency of the boost converter circuitry.

The efficiency value may be determined based on a lookup table defining input power values, boost ratio values and corresponding efficiency values for the boost converter circuitry.

According to a third aspect, the invention provides a method for controlling an input current limit of boost converter circuitry, the method comprising:

receiving a power dissipation value of the boost converter circuitry; and controlling an input current limit of the boost converter circuitry based on the power dissipation value.

According to a fourth aspect, the invention provides a computer-readable medium storing instructions which, when executed by processing circuitry, cause the processing circuitry to perform the method of any of the first to third aspects.

According to a fifth aspect, the invention provides a system for controlling an input current limit of boost converter circuitry, the system comprising a controller configured to:

receive a power dissipation value for the boost converter circuitry; and control an input current limit of the boost converter circuitry based on the power dissipation value.

The controller may be further configured to:

determine an input power value of the boost converter circuitry;

receive an efficiency value for the boost converter circuitry at the determined input power value; and determine, based on the efficiency value and the input power value, the power dissipation value for the boost converter circuitry.

Determining the input power value of the boost converter circuitry may comprise:

receiving an input current value and an input voltage value and determining the input power value based on the input current value and the input voltage value.

The system accordingly may further comprise current monitor circuitry configured to output a signal indicative of the input current and voltage monitor circuitry configured to output a signal indicative of the input voltage.

The controller may be configured to control the input current limit of the boost converter circuitry based on the power dissipation value by:

comparing the power dissipation value to a threshold power dissipation value; and if the power dissipation value exceeds the threshold power dissipation value, reducing the input current limit; and if the power dissipation value is equal to or lower than the threshold power dissipation value, maintaining the input current limit at an existing level.

The controller may be configured to control the input current limit of the boost converter circuitry based on the power dissipation value by:

determining a change in a junction temperature of a semiconductor die on which the boost converter circuitry is implemented;

comparing the change in the junction temperature to a threshold temperature change value; and if the change in the junction temperature exceeds the threshold temperature change value, reducing the input current limit; and if the change in the junction temperature is equal to or lower than the threshold temperature change value, maintaining the input current limit at an existing level.

The controller may be configured to control the input current limit of the boost converter circuitry based on the power dissipation value by:

determining a final junction temperature value of a semiconductor die on which the boost converter circuitry is implemented resulting from power dissipation;

comparing the final junction temperature value to a threshold junction temperature value; and if the final junction temperature value exceeds the threshold temperature change value, reducing the input current limit; and if the final junction temperature value is equal to or lower than the threshold junction temperature value, maintaining the input current limit at an existing level.

The controller may be configured to control the input current limit of the boost converter circuitry based on the power dissipation value by:

determining a duration for which the boost converter circuitry is permitted to dissipate power at the power dissipation value; and controlling the input current limit of the boost converter circuitry based on the determined duration.

The controller may be configured to determine the duration for which the boost converter is permitted to dissipate power at the power dissipation value by comparing the dissipated power value to a predefined power dissipation vs duration function.

The controller may be configured to dynamically calculate the efficiency value during operation of the boost converter circuitry.

The controller may be configured to determine the efficiency value based on a polynomial defining a relationship between an input power of the boost converter circuitry, a boost ratio of the boost converter circuitry and an efficiency of the boost converter circuitry.

The controller may be configured to determine the efficiency value based on a lookup table defining input power values, boost ratio values and corresponding efficiency values for the boost converter circuitry.

The controller may be configured to control the input current limit of the boost converter circuitry to limit a die temperature increase or a rate of die temperature increase of a semiconductor die on which the boost converter circuitry is implemented.

According to a sixth aspect, the invention provides a system for controlling an input current limit of boost converter circuitry, the system comprising a controller configured to:

receive a power dissipation value of the boost converter circuitry;

determine a duration for which the boost converter circuitry is permitted to dissipate power at the power dissipation value; and control the input current limit of the boost converter circuitry based on the determined duration.

The controller may be further configured to:

determine an input power value of the boost converter circuitry;

receive an efficiency value for the boost converter circuitry at the determined input power value; and determine, based on the efficiency value and the input power value, the power dissipation value for the boost converter.

The controller may be configured to dynamically calculate the efficiency value during operation of the boost converter circuitry.

The controller may be configured to determine the efficiency value based on a polynomial defining a relationship between an input power of the boost converter circuitry, a boost ratio of the boost converter circuitry and an efficiency of the boost converter circuitry.

The controller may be configured to determine the efficiency value based on a lookup table defining input power values, boost ratio values and corresponding efficiency values for the boost converter circuitry.

According to a seventh aspect, the invention provides a system for controlling an input current limit of boost converter circuitry, the system comprising a controller configured to:

determine a power dissipation value of the boost converter circuitry; and control an input current limit of the boost converter circuitry based on the power dissipation value.

According to an eighth aspect, the invention provides an integrated circuit comprising a system according to the sixth or seventh aspect.

According to an eighth aspect, the invention provides a host device comprising a system according to the sixth or seventh aspect.

The host device may comprise a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console a VR or AR device, a mobile telephone, a portable audio player or other portable device.

BRIEF DESCRIPTION OF THE DRAWINGS

Embodiments of the invention will now be described, strictly by way of example only, with reference to the accompanying drawings, of which.

DETAILED DESCRIPTION

Figure 1:
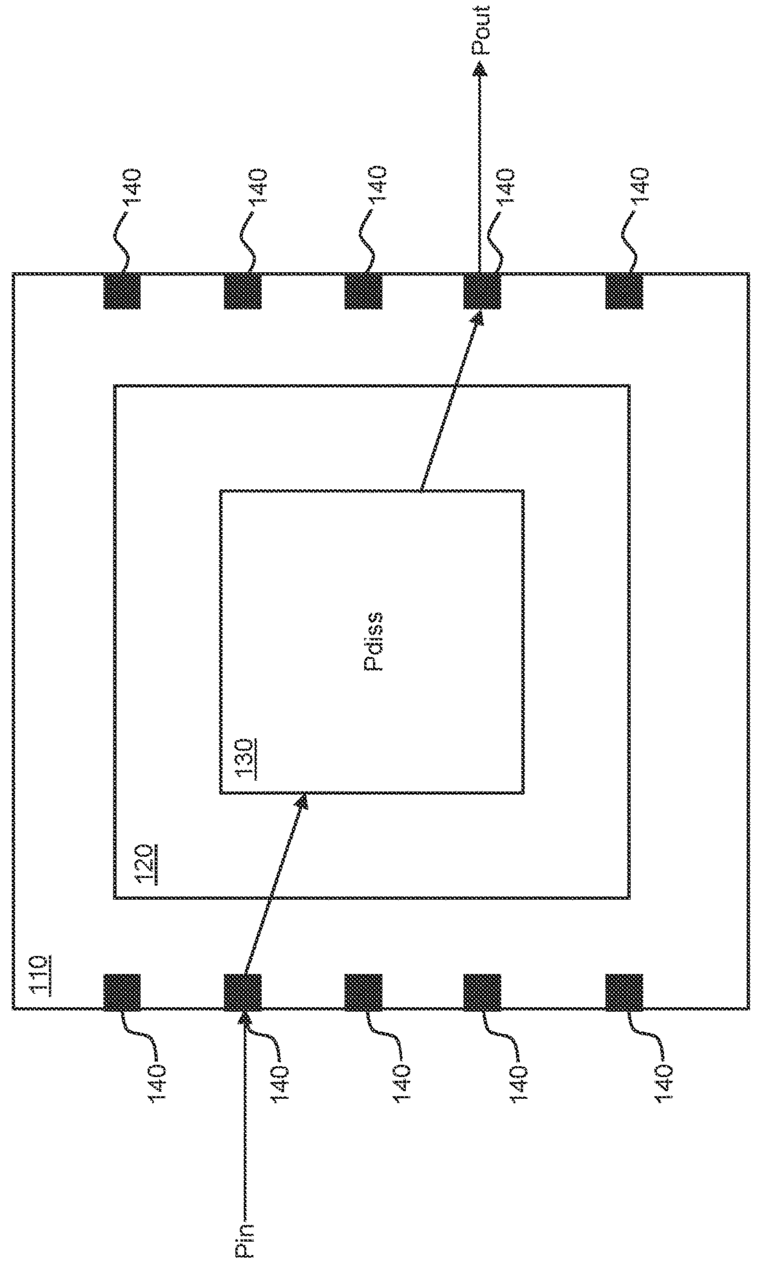
FIG. 1 is a schematic representation of a packaged integrated circuit device comprising boost converter circuitry.
Figure 1:

FIG. 1 is a schematic representation of a packaged integrated circuit (IC) comprising boost converter circuitry. As shown in FIG. 1, the packaged IC 100 includes a protective package 110 that house a semiconductor die 120 on which boost converter circuitry 130 is implemented. The package 110 includes a plurality of external connectors 140 (e.g. conductive pins, pads or balls) which are internally coupled to the semiconductor die 120 to permit connection of the semiconductor die 120 to external components.

As the boost converter circuitry 130 cannot operate with 100% efficiency, in operation of the boost converter circuitry 130, power is dissipated as heat, causing the temperature of the semiconductor die 120 to increase. The power Pdiss dissipated as heat into the semiconductor is the difference between the power Pin supplied to the IC 100 and the power Pout output by the IC 100, i.e. Pdiss=Pin−Pout. Thus, assuming that the power efficiency of the boost converter circuitry 130 remains constant, the temperature of the semiconductor die 120 will increase as the input power Pin and/or output power Pout increases.

As will be appreciated by those of ordinary skill in the art, the boost converter circuitry 130 is the dominant source of power dissipated as heat into the semiconductor die 120, but other elements of the IC 100 will also dissipate some power as heat, particularly if the IC 100 includes other circuitry in addition to the boost converter circuitry 130. Thus, the value Pdiss is representative of the total power dissipated as heat into the semiconductor die 120, i.e. the power dissipation of the whole IC, rather than just the boost converter circuitry 130. For clarity and brevity, the power dissipation value Pdiss is referred to herein as being indicative of the power dissipation of the boost converter circuitry, but it is to be appreciated that references to the power dissipation of the boost converter circuitry should be interpreted as references to the power dissipation of the whole IC.

The boost converter circuitry 130 may be designed with a plurality of different specification ranges, each intended for a different use case. For example, the boost converter circuitry 130 may have an input voltage range of 3 to 12 VDC, an output voltage range of 5 to 15 VDC and a maximum input current limit of 2 A, so that the input power Pin can be approximately 6 W when the input voltage is 3V.

In voltage regulated boost converter circuitry, the boost converter circuitry 130 is operative to maintain the output voltage at a predefined level, and so the boost converter circuitry will attempt to draw the input power (current) required to satisfy an output power (current) demand. Because of the inherent inefficiency of the boost converter circuitry 130 (i.e. because the output power Pout cannot be equal to the input power Pin because the boost converter circuitry 130 cannot operate at 100% efficiency), in order to support a given output power demand, the input power to the boost converter circuitry 130 must be greater than the output power demand.

For example, if the boost converter circuitry 130 is operating in a configuration or mode in which it converts an input voltage of 5 VDC to an output voltage of 10 VDC, then if a current demand of a load coupled to an output of the boost converter circuitry is 400 mA, the required output power Pout is 10V×400 mA=4 W. If the boost converter circuitry 130 were able to operate with 100% efficiency, the input current required to support this output power Pout at the 5V input voltage would be 800 mA (because 5V×800 mA=4 W). However, as the boost converter circuitry 130 cannot operate with 100% efficiency, the input power Pin must be greater than the required output power Pout, and so the boost converter circuitry 130 will draw more than 800 mA of input current.

Thus, assuming that the input voltage to the boost converter circuitry 130, the output voltage supplied by the boost converter circuitry 130 to the load, and the efficiency of the boost converter circuitry 130 are substantially constant, in operation of the boost converter circuitry 130 the input current is determined by load conditions (which affect the load current demand).

The boost converter circuitry 130 may be designed to provide a predefined maximum output power. However, if there are no limitations on the input current it is possible that in some circumstances the output power of the boost converter circuitry 130 may exceed the predefined maximum output power.

For example, if the boost converter is operating in a configuration or mode in which it converts an input voltage of 10 VDC to an output voltage of 15 VDC with a fixed input current limit of 2 A, then if the load draws a current of more than 667 mA, the maximum output power of 10 W is exceeded (because the output voltage of 15V×the load current of 667 mA=10 W). This corresponds to an input current of around 1 A, which is well below the 2 A input current limit.

As demonstrated by the above example, in certain circumstances (which may not have been foreseen when deciding on the specifications for the boost converter circuitry 130), it is possible that the boost converter circuitry 130 may be made to operate outside of its intended or specified operational parameters. This may lead to excessively increased die junction temperature and/or electrical overstress conditions and associated damage and/or other problems.

The present disclosure proposes method and system for controlling an input current limit of boost converter circuitry 130 of the kind described above with reference to FIG. 1 to reduce the risk of damage or other problems that may arise as a result of excessive increases or rates of increase in die junction temperature.

Figure 2:
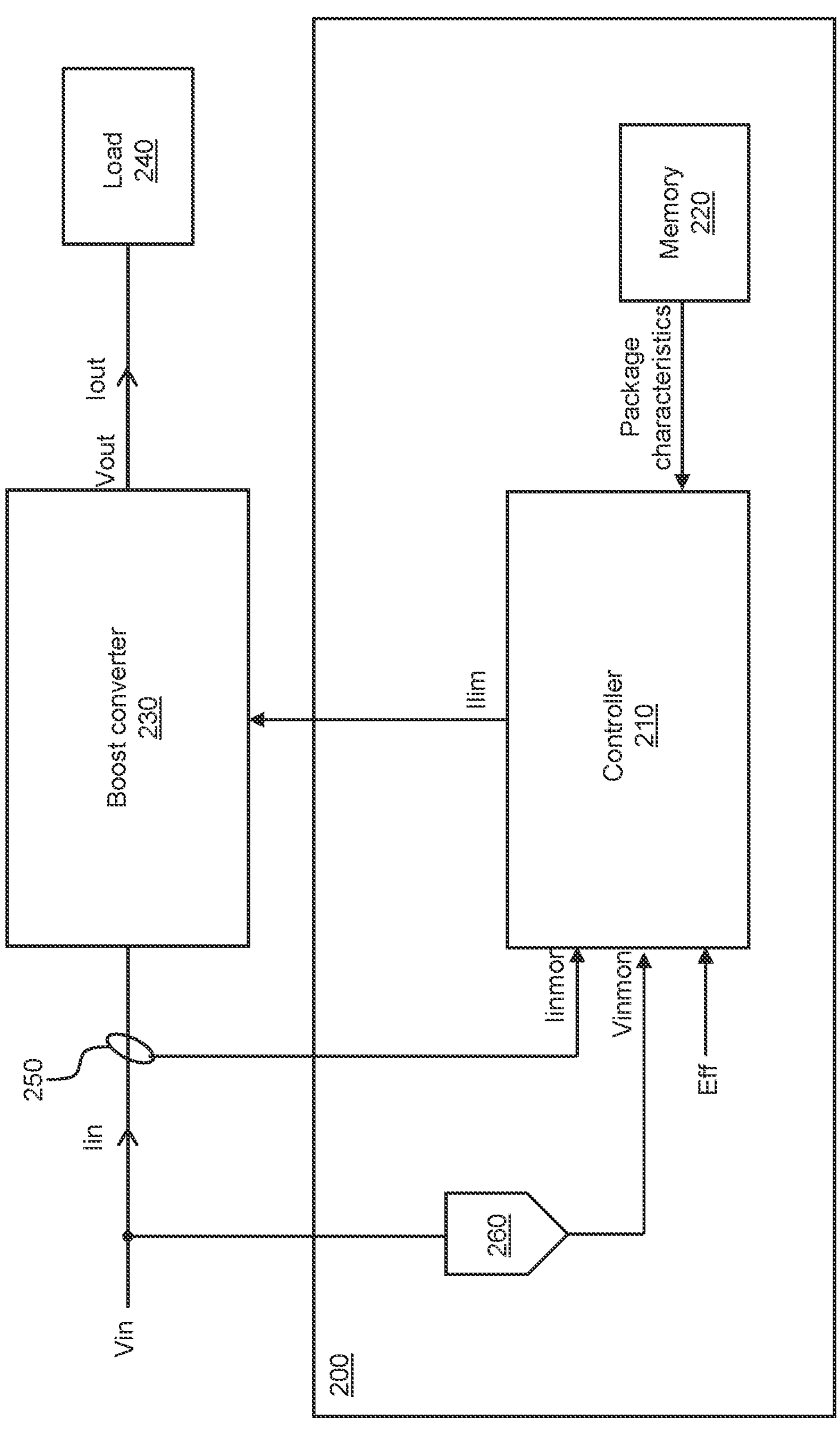
FIG. 2 is a schematic representation of a system for controlling an input current limit of boost converter circuitry according to the present disclosure.

FIG. 2 is a schematic representation of a system for controlling an input current limit of boost converter circuitry according to the present disclosure.

As shown generally at 200 in FIG. 2, the system 200 comprises a controller 210 configured to provide a signal Ilim indicative of an input current limit to boost converter circuitry 230 which supplies an output voltage Vout and an output current Iout to a load 240. The boost converter circuitry 230 may be implemented as a packaged IC of the kind described above with reference to FIG. 1, and thus may comprise a semiconductor die on which the boost converter circuitry 230 is implemented, encased in a protective package.

The controller 210 may be implemented in circuitry (e.g. integrated circuitry implemented on one or more integrated circuits, or discrete circuitry), or may alternatively be implemented in processing hardware such as a digital signal processor (DSP), an application specific integrated circuit (ASIC), a microprocessor or microcontroller executing suitable instructions, software or program code.

The controller 210 is configured to receive a signal Iinmon indicative of an input current Iin to the boost converter circuitry 230. The signal Iinmon may be supplied, for example, by input current monitor circuitry (shown schematically at 250 in FIG. 2), which may comprise, for example, for example, a current sense resistor of known resistance coupled in series between an output terminal of a power supply that supplies the input voltage Vin to the boost converter circuitry 230 and an power supply input terminal of the boost converter circuitry 230 and analog to digital converter (ADC) circuitry coupled across the current sense resistor such that a digital signal output by the ADC circuitry is representative of a voltage across the current sense resistor, which is in turn indicative of a current through the resistor and thus the input current to the boost converter circuitry 230.

The controller 210 is further configured to receive a signal Vinmon indicative of an input voltage Vin to the boost converter circuitry 230. The signal Vinmon may be supplied, for example, by input voltage monitor circuitry 260 which may comprise, for example, ADC circuitry having an input coupled to the power supply input terminal of the boost converter circuitry 230 and an output coupled to an input of the controller 210, such that a digital ADC output signal representing the magnitude of the input voltage Vin is provided by the ADC circuitry to the controller 210 as the signal Vinmon indicative of the input voltage Vin.

The controller 210 is further configured to receive a signal indicative of an efficiency value Eff for the boost converter circuitry 230.

The efficiency value may be dynamically calculated or estimated (e.g. by processing circuitry external to the controller 210, or by the controller 210 itself) during operation of the boost converter circuitry 230, e.g. based on measured or otherwise determined input and output currents and voltages, or may alternatively be a fixed value indicative of an estimated efficiency of the boost converter circuitry 230.

The controller 210 is further configured to receive predefined package characteristics or parameters (e.g. a package junction to ambient thermal resistance $\theta_{JA}$ of a package of the boost converter circuitry 230). In some examples these predefined package characteristics are stored in a memory 220, which in the illustrated example is external to the controller 210, but which could equally be internal to the controller 210 (e.g. the memory 220 could be on-chip memory of a DSP IC).

The controller 210 is configured to dynamically adjust an input current limit for the boost converter circuitry 230 based on the input voltage Vin, the input current Iin, and the efficiency value Eff.

Figure 3:
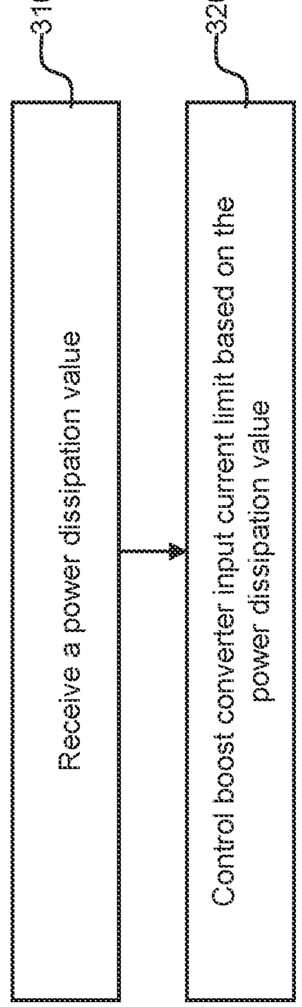
FIG. 3 is a flow diagram illustrating an example method for controlling the input current limit of boost converter circuitry in the system of FIG. 2.
Figure 3:
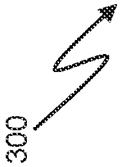

FIG. 3 is a flow diagram illustrating an example method 300 performed by the controller 210 to control the input current limit of the boost converter circuitry 230 in the system 200 of FIG. 2.

In a first step 310 of the method 300, the controller 210 determines a power dissipation value Pdiss indicative of the on-chip power dissipation of the boost converter circuitry 230.

In a subsequent step 320, the controller 210 controls the input current limit of the boost converter circuitry 230 based on the determined power dissipation value Pdiss.

Figure 4:
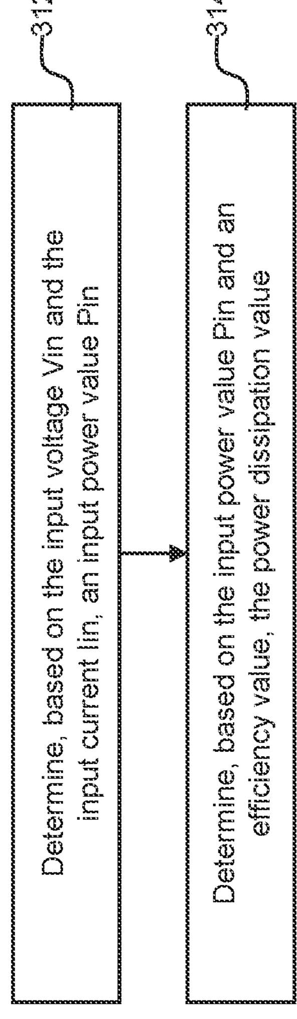
FIG. 4 is a flow diagram illustrating steps in one example approach to determining a power dissipation value in the method of FIG. 3.
Figure 4:
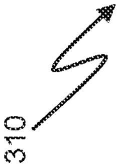

FIG. 4 is a flow diagram illustrating steps that may be performed by the controller 210 in one example approach to determining the power dissipation value Pdiss in the first step 310 of the method 300.

In a step 312, the controller 210 determines an input power value Pin, based on the input voltage Vin and the input current Iin, by multiplying the input voltage Vin by the input current Iin.

In a subsequent 314, the controller 210 determines the power dissipation value Pdiss for an on-chip power dissipation, based on the determined input power value Pin and the efficiency value Eff.

In some examples, the controller 210 may determine the power dissipation value Pdiss based on the determined input power value Pin and the efficiency value Eff alone. In such examples, the controller 210 may first calculate an estimated output power value Pout as the product of the efficiency value Eff (expressed as a decimal value less than 1) and the determined input power value Pin, i.e. Pout=Pin×Eff. The controller 210 may then calculate the power dissipation value Pdiss by subtracting the estimated output power value Pout from the determined input power value Pin, i.e. Pdiss=Pin−Pout.

In other examples, the controller 210 may be programmed or otherwise provided with a relationship between the determined input power Pin, the efficiency value Eff and a currently selected boost ratio for the boost converter circuitry 230.

This relationship may be defined by a polynomial which allows the efficiency value Eff to be calculated based on the determined input power value Pin and the currently selected boost ratio.

Alternatively, the controller 210 may be programmed or otherwise provided with a lookup table populated with input power values, boost ratio values and the corresponding efficiency values. Table 1 below shows an example of such a lookup table. The controller 210 may select the appropriate efficiency value Eff for the determined input power value Pin and currently selected boost ratio from the lookup table.

TABLE 1

| Input power value Pin | Boost ratio | Efficiency value Eff |
|---|---|---|
| 100 mW | 1.2 | 90% |
| 100 mW | 2 | 91% |
| 100 mW | 4 | 92% |
| 500 mW | 1.2 | 91% |
| 500 mW | 2 | 92% |
| 500 mW | 4 | 93% |
| 2 W | 1.2 | 92% |
| 2 W | 2 | 93% |
| 2 W | 4 | 94% |

In a further alternative, the controller may receive the power dissipation value Pdiss (or a signal indicative of the power dissipation value Pdiss) from a system, apparatus or circuitry that measures the real-time power dissipation or efficiency of the boost converter circuitry 230 (e.g. the system described in the applicant's co-pending U.S. provisional patent application No. 63/440,942, filed on 25 Jan. 2023, which is incorporated by reference in its entirety herein).

As described above, having determined or received the power dissipation value Pdiss, the controller 210 subsequently (at step 330) controls the input current limit of the boost converter circuitry 230 based on the determined power dissipation value Pdiss.

Figure 5:
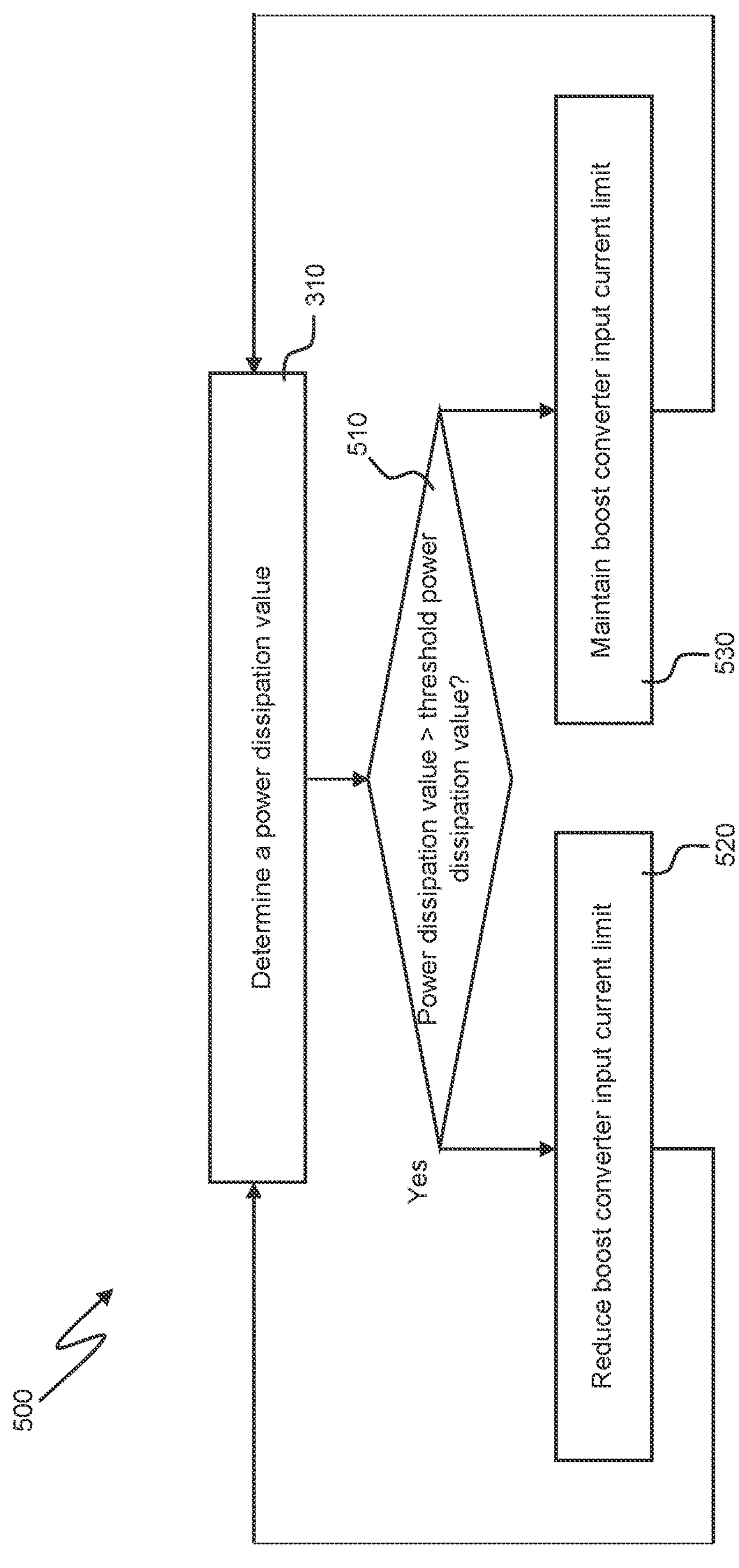
FIG. 5 is a flow diagram illustrating steps in one example approach to controlling the input current limit of boost converter circuitry in the system of FIG. 2.

FIG. 5 is a flow diagram illustrating steps that may be performed by the controller 210 in one example approach to controlling the input current limit of the boost converter circuitry 230. As shown generally at 500 in FIG. 5, in a first step 510, the controller 210 compares the determined power dissipation value Pdiss with one or more threshold power dissipation values.

If the determined power dissipation value exceeds a threshold power dissipation value, the controller 210 reduces the input current limit (step 520), to reduce the risk that the on-chip power dissipation could cause excessive heating of the semiconductor die on which the boost converter circuitry 230 is implemented.

If the determined power dissipation value Pdiss subsequently falls below the threshold, the controller 210 may increase the input current limit.

If the determined power dissipation value is equal to or lower than the threshold power dissipation value, the controller may maintain the input current limit at its existing level (step 530).

Figure 6:
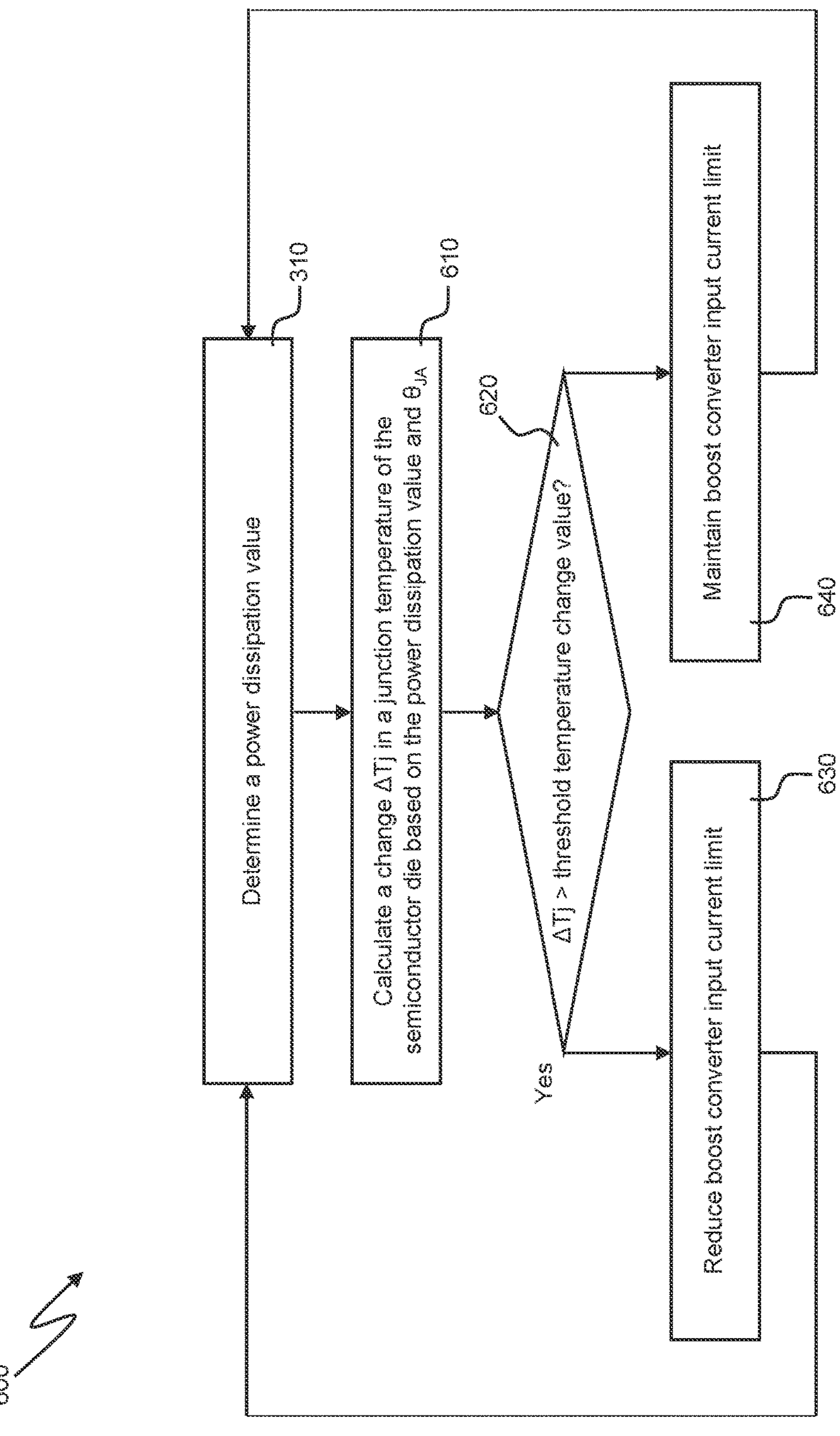
FIG. 6 is a flow diagram illustrating steps in an alternative example approach to controlling the input current limit of boost converter circuitry in the system of FIG. 2.

FIG. 6 is a flow diagram illustrating steps that may be performed by the controller 210 in an alternative example approach to controlling the input current limit of the boost converter circuitry 230 based on a change in a junction temperature of the semiconductor die.

As shown generally at 600 in FIG. 6, in a first step 610, the controller 210 may dynamically calculate a change ΔTj in a junction temperature of the semiconductor die, based on the determined power dissipation value Pdiss and the package junction to ambient thermal resistance value $\theta_{JA}$, by multiplying the determined power dissipation value Pdiss by the junction to ambient thermal resistance value $\theta_{JA}$, i.e. $\Delta Tj = Pdiss \times \theta_{JA}$.

Alternatively, the change ΔTj in junction temperature may be estimated, determined or predicted by the controller 210 using a Foster thermal model of the semiconductor die that is stored in or otherwise provided to the controller 210.

The controller 210 may compare the calculated change ΔTj in junction temperature of the semiconductor die to a predefined threshold temperature change value (step 620) to detect if there is a risk that the junction temperature will exceed a safe limit.

If the calculated change ΔTj in junction temperature exceeds the predefined threshold temperature change value (indicating a risk that the junction temperature will exceed the safe limit), the controller 210 may reduce the input current limit of the boost converter circuitry 230 (step 630).

If the calculated change ΔTj in junction temperature subsequently falls below the predefined threshold temperature change value, the controller 210 may increase the input current limit.

If the calculated change ΔTj in junction temperature is equal to or lower than the predefined threshold temperature change value (indicating no risk or a low risk that the junction temperature will exceed the safe limit), the controller 210 may maintain the input current limit of the boost converter circuitry 230 at its current level (step 640).

Additionally or alternatively, if an initial junction temperature Tj0 is known (e.g. from an on-chip sensor measurement), a final junction temperature resulting from the on-chip power dissipation can be estimated, determined or predicted by the controller 210 by adding the change in junction temperature ΔTj to the initial junction temperature Tj0, i.e. Tjfinal=Tj0+ΔTj. Alternatively, the final junction temperature may be estimated, determined or predicted by the controller 210 using a Foster thermal model of the semiconductor die that is stored in or otherwise provided to the controller 210.

Figure 7:
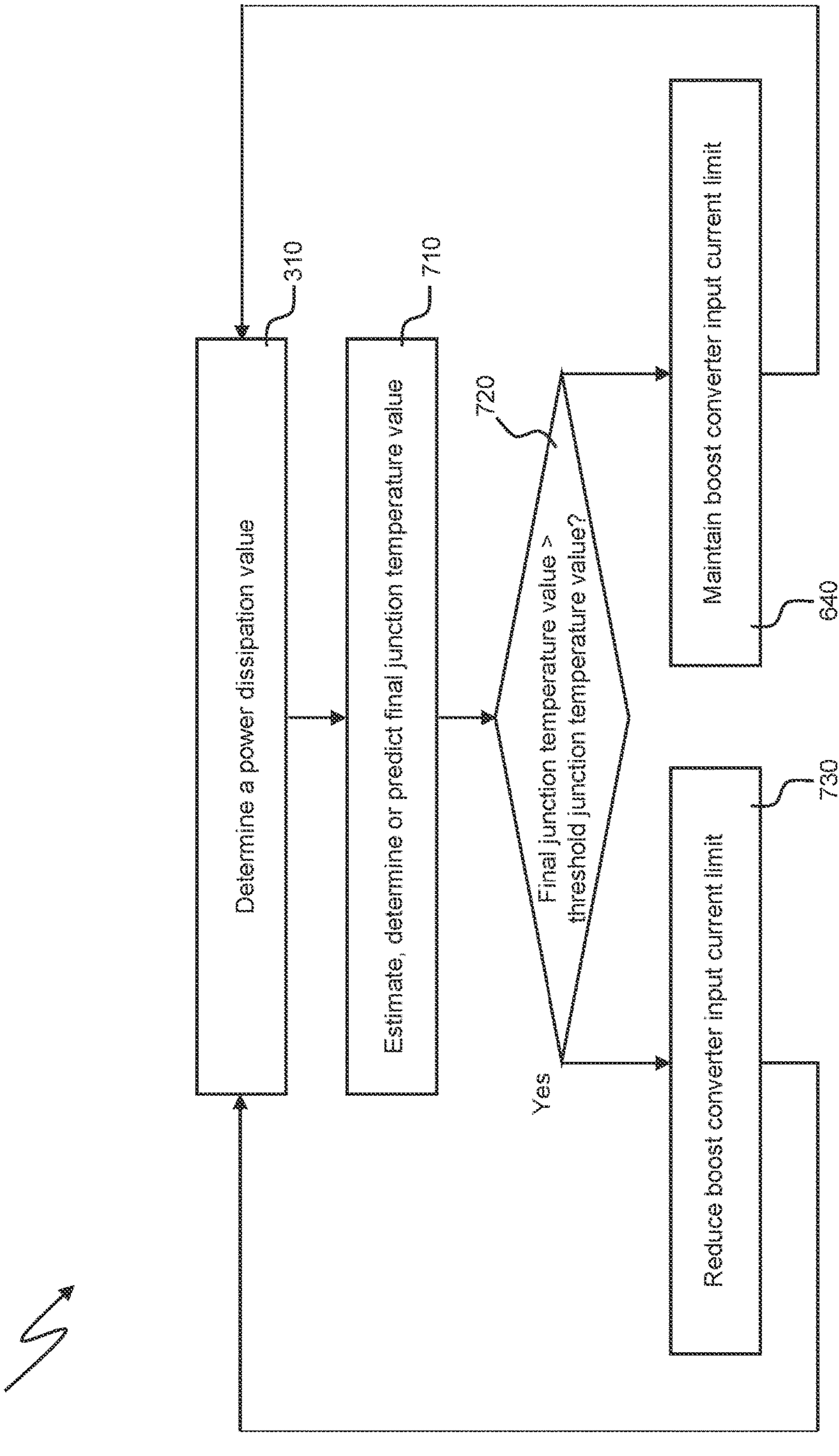
FIG. 7 is a flow diagram illustrating steps in a further alternative example approach to controlling the input current limit of boost converter circuitry in the system of FIG. 2.

FIG. 7 is a flow diagram illustrating steps that may be performed by the controller 210 in an alternative example approach to controlling the input current limit of the boost converter circuitry 230 based on an estimated, determined or predicted final junction temperature of the semiconductor die.

As shown generally at 700 in FIG. 7, in a first step 710, the controller 210 may estimate, determine or predict a final junction temperature value resulting from the on-chip power dissipation, as described above.

The controller 210 may subsequently compare the estimated, predicted or determined final junction temperature value to a predefined threshold junction temperature value (step 720) to detect if there is a risk that the junction temperature will exceed a safe limit.

If the estimated, predicted or determined final junction temperature exceeds the predefined threshold junction temperature value (indicating a risk that the junction temperature will exceed the safe limit), the controller 210 may reduce the input current limit of the boost converter circuitry 230 (step 730).

If the estimated, predicted or determined final junction temperature subsequently falls below the predefined threshold junction temperature value, the controller 210 may increase the input current limit.

If the estimated, predicted or determined final junction temperature is less than the predefined threshold junction temperature value (indicating no risk, or a low risk that the junction temperature will exceed the safe limit), the controller 210 may maintain the input current limit of the boost converter circuitry 230 at its current level (step 740).

In some examples, the controller 210 may be operative to adjust the input current limit of the boost converter circuitry 230 to permit the boost converter circuitry 230 to dissipate different levels of power for different durations, in order to maintain on-chip power dissipation within safe limits, e.g. below a level that could lead to damage or other problems due to excessive junction temperature, junction temperature increase or rate of junction temperature increase.

Figure 8:
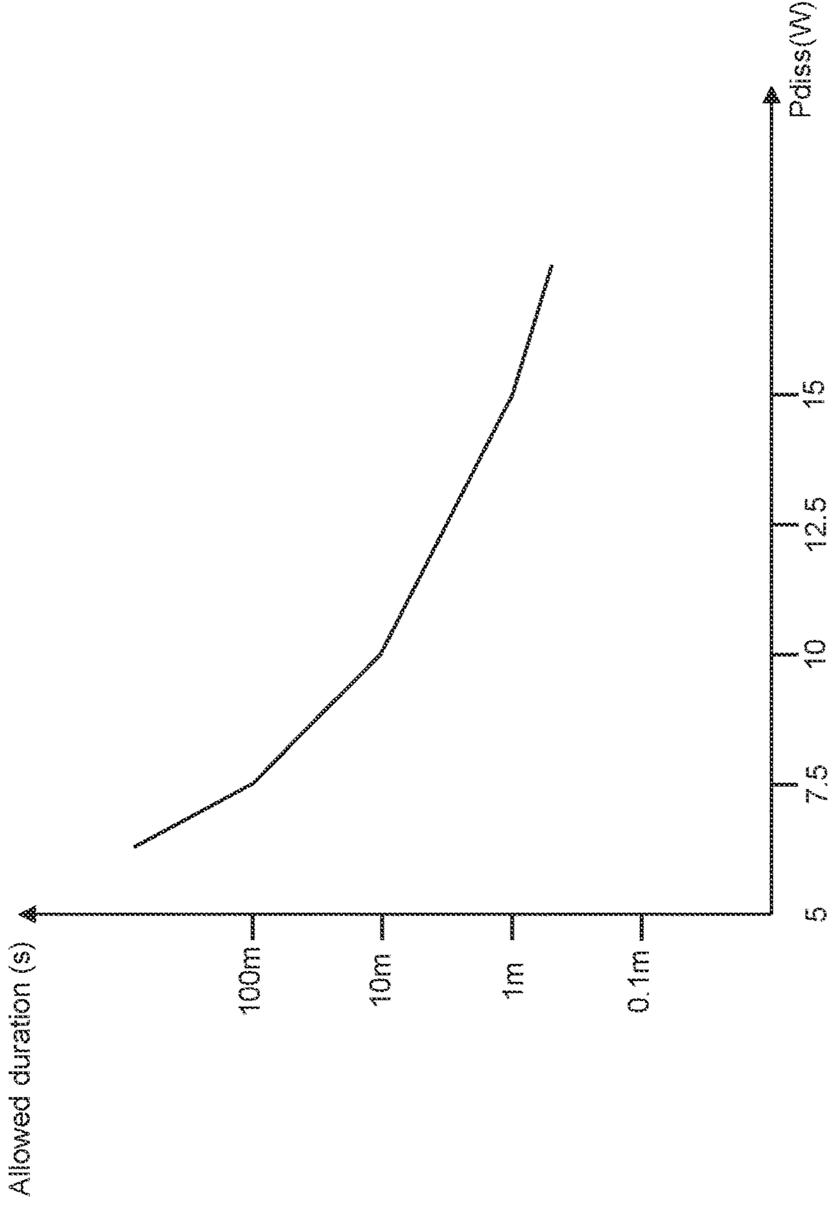
FIG. 8 is a graphical representation of a function defining a duration for which boost converter circuitry is permitted to supply different output power levels.

FIG. 8 is a graphical representation of a function defining a duration for which the boost converter circuitry 230 is permitted to dissipate power at different levels. Such a function may be implemented by the controller 210 to permit the boost converter circuitry 230 to supply sufficient power to support fast transient high output voltages (such as may arise, for example, in Class D audio amplifier circuitry) while still providing a safety mechanism against possible damage caused by excessive die temperatures or die temperature increases arising due to increased power dissipation as the output power supplied by the boost converter circuitry increases.

According to the function illustrated in FIG. 8, for boost converter circuitry 230 designed or configured to be able to dissipate a power of 5 W indefinitely, the boost converter circuitry 230 may be permitted to dissipate a power of 7.5 W for only 100 ms, to dissipate a power of 10 W for only 10 ms, and to dissipate a power of 15 W for only 1 ms, in order to maintain the on-chip power dissipation and thus the die temperature, die temperature change and/or rate of die temperature change within safe limits.

Figure 9:
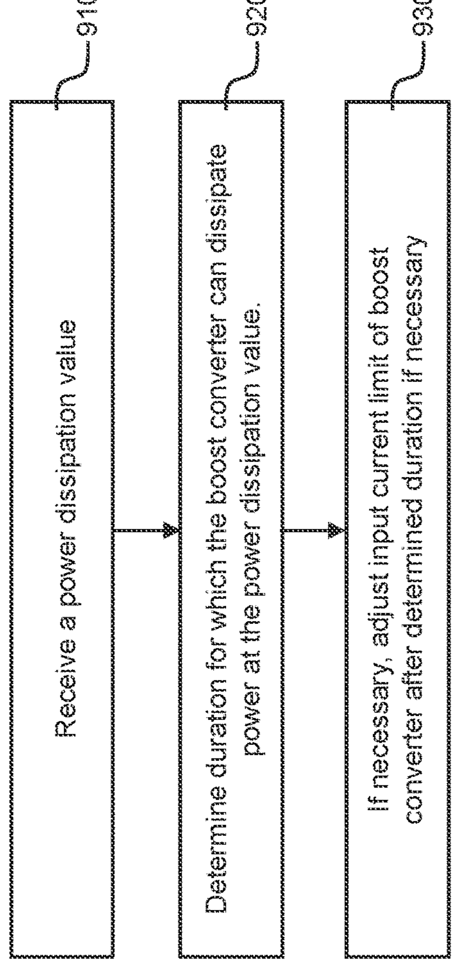
FIG. 9 is a flow diagram illustrating steps in an example approach to controlling the input current limit of boost converter circuitry 230 in the system of FIG. 2, based on a power vs duration function of the kind shown in FIG. 8.
Figure 9:
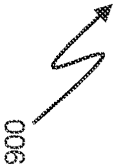

FIG. 9 is a flow diagram illustrating steps that may be performed by the controller 210 in an example approach to controlling the input current limit of the boost converter circuitry 230 based on a power dissipation vs duration function of the kind described above with reference to FIG. 8.

In a first step 910, the controller 210 receives a power dissipation value Pdiss. The output power dissipation value Pdiss may be determined as described above as the difference between an input power value Pin and an output power value Pout, for example.

In a second step 920, the controller 210 compares the received power dissipation value Pdiss to a predefined power dissipation vs duration function to determine a duration (e.g. a maximum allowable duration) for which the boost converter circuitry 230 can dissipate power at the received power dissipation value Pdiss.

Subsequently, at step 930, the controller 210 adjusts the input current limit of the boost converter circuitry 230 after a time period equal to the duration determined in the second step 920, if necessary.

For example, if the controller 210 implements the function described above with reference to FIG. 8, if the power dissipation value Pdiss is greater than 5 W, the controller 210 need not adjust the input current limit. However, if the power dissipation value Pout rises to 7.5 W (e.g. due to an increase in input power caused by an increase in output power demand), the controller 210 will reduce the input current limit of the boost converter circuitry 230 after a period of 100 ms has elapsed, to reduce the risk of damage resulting from an excessive die temperature or die temperature increase arising because of the increased on-chip power dissipation. Similarly, if the power dissipation value Pdiss rises to 10 W, the controller 210 will reduce the input current limit of the boost converter circuitry 230 after a period of 10 ms has elapsed, and if the power dissipation value Pdiss rises to 15 W, the controller 210 will reduce the input current limit of the boost converter circuitry 230 after a period of 1 ms has elapsed.

In this way the boost converter circuitry 230 is permitted to supply sufficient output power to downstream circuitry (e.g. amplifier) to support transient increases in power (e.g. load current) demand, while reducing the risk of potentially damaging increases in die temperature.

As will be apparent from the foregoing description and the accompanying drawings, the system and methods of the present disclosure provide different approaches to controlling the input current limit of boost converter circuitry, which all reduce the risk of damage and/or other problems that could arise as a result of excessive temperatures, temperature increases or rates of temperature increase resulting from increased power dissipation by the boost converter circuitry.

The circuitry described above with reference to the accompanying drawings may be incorporated in a host device such as a laptop, notebook, netbook or tablet computer, a gaming device such as a games console or a controller for a games console, a virtual reality (VR) or augmented reality (AR) device, a mobile telephone, a portable audio player or some other portable device, or may be incorporated in an accessory device for use with a laptop, notebook, netbook or tablet computer, a gaming device, a VR or AR device, a mobile telephone, a portable audio player or other portable device.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word “comprising” does not exclude the presence of elements or steps other than those listed in a claim, “a” or “an” does not exclude a plurality, and a single feature or other unit may fulfil the functions of several units recited in the claims. Any reference numerals or labels in the claims shall not be construed so as to limit their scope.

As used herein, when two or more elements are referred to as “coupled” to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, “each” refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words “means for” or “step for” are explicitly used in the particular claim.

The invention claimed is:

1. A method for controlling an input current limit of boost converter circuitry, the method comprising:

receiving a power dissipation value for the boost converter circuitry, wherein the power dissipation value is representative of power dissipated by the boost converter circuitry in operation of the boost converter circuitry; and controlling the input current limit of the boost converter circuitry based on the power dissipation value;

wherein controlling the input current limit of the boost converter circuitry based on the power dissipation value comprises:

comparing the power dissipation value to a threshold power dissipation value;

if the power dissipation value exceeds the threshold power dissipation value, reducing the input current limit; and if the power dissipation value is equal to or lower than the threshold power dissipation value, maintaining the input current limit at an existing level;

or wherein controlling the input current limit of the boost converter circuitry based on the power dissipation value comprises:

determining a change in a junction temperature of a semiconductor die on which the boost converter circuitry is implemented;

comparing the change in the junction temperature to a threshold temperature change value; and if the change in the junction temperature exceeds the threshold temperature change value, reducing the input current limit; and if the change in the junction temperature is equal to or lower than the threshold temperature change value, maintaining the input current limit at an existing level;

or wherein controlling the input current limit of the boost converter circuitry based on the power dissipation value comprises:

determining a final junction temperature value of a semiconductor die on which the boost converter circuitry is implemented resulting from power dissipation;

comparing the final junction temperature value to a threshold junction temperature value; and if the final junction temperature value exceeds the threshold temperature change value, reducing the input current limit; and if the final junction temperature value is equal to or lower than the threshold junction temperature value, maintaining the input current limit at an existing level;

or wherein controlling the input current limit of the boost converter circuitry based on the power dissipation value comprises:

determining a duration for which the boost converter circuitry is permitted to dissipate power at the power dissipation value; and controlling the input current limit of the boost converter circuitry based on the determined duration.

2. A method according to claim 1, wherein the method further comprises determining the power dissipation value based on an input power value of the boost converter circuitry and an efficiency value for the boost converter circuitry at the determined input power value.

3. A method according to claim 2, wherein determining the input power value of the boost converter circuitry comprises:

receiving an input current value and an input voltage value and determining the input power value based on the input current value and the input voltage value.

4. A method according to claim 3, wherein the input current value is based on a signal received from input current monitor circuitry and the input voltage value is based on a signal received from input voltage monitor circuitry.

5. A method according to claim 1, wherein determining the duration for which the boost converter is permitted to dissipate power at the power dissipation value comprises comparing the power dissipation value to a predefined power dissipation vs duration function.

6. A method according to claim 2, wherein the efficiency value is dynamically calculated or dynamically measured during operation of the boost converter circuitry.

7. A method according to claim 2, wherein the efficiency value is determined based on a polynomial defining a relationship between an input power of the boost converter circuitry, a boost ratio of the boost converter circuitry and an efficiency of the boost converter circuitry or wherein the efficiency value is determined based on a lookup table defining input power values, boost ratio values and corresponding efficiency values for the boost converter circuitry.

8. A method according to claim 1, wherein the input current limit of the boost converter circuitry is controlled to limit a die temperature increase or a rate of die temperature increase of a semiconductor die on which the boost converter circuitry is implemented.

9. A non-transitory computer-readable medium storing instructions which, when executed by processing circuitry, cause the processing circuitry to perform the method of claim 1.

10. A method for controlling an input current limit of boost converter circuitry, the method comprising:

receiving a power dissipation value of the boost converter circuitry, wherein the power dissipation value is representative of power dissipated by the boost converter circuitry in operation of the boost converter circuitry;

determining a duration for which the boost converter circuitry is permitted to dissipate power at the power dissipation value; and controlling the input current limit of the boost converter circuitry based on the determined duration;

wherein the method further comprises:

determining an input power value of the boost converter circuitry;

receiving an efficiency value for the boost converter circuitry at the determined input power value; and determining, based on the efficiency value and the input power value, the power dissipation value for the boost converter circuitry, wherein the efficiency value is determined based on a polynomial defining a relationship between an input power of the boost converter circuitry, a boost ratio of the boost converter circuitry and an efficiency of the boost converter circuitry or wherein the efficiency value is determined based on a lookup table defining input power values, boost ratio values and corresponding efficiency values for the boost converter circuitry.

11. A method according to claim 10, wherein the efficiency value is dynamically calculated or dynamically measured during operation of the boost converter circuitry.

12. A system for controlling an input current limit of boost converter circuitry, the system comprising a controller configured to:

receive a power dissipation value for the boost converter circuitry, wherein the power dissipation value is representative of power dissipated by the boost converter circuitry in operation of the boost converter circuitry; and control the input current limit of the boost converter circuitry based on the power dissipation value;

wherein the controller is configured to control the input current limit of the boost converter circuitry based on the power dissipation value by:

comparing the power dissipation value to a threshold power dissipation value; and if the power dissipation value exceeds the threshold power dissipation value, reducing the input current limit; and if the power dissipation value is equal to or lower than the threshold power dissipation value, maintaining the input current limit at an existing level;

or wherein the controller is configured to control the input current limit of the boost converter circuitry based on the power dissipation value by:

determining a change in a junction temperature of a semiconductor die on which the boost converter circuitry is implemented;

comparing the change in the junction temperature to a threshold temperature change value; and if the change in the junction temperature exceeds the threshold temperature change value, reducing the input current limit; and if the change in the junction temperature is equal to or lower than the threshold temperature change value, maintaining the input current limit at an existing level;

or wherein the controller is configured to control the input current limit of the boost converter circuitry based on the power dissipation value by:

determining a final junction temperature value of a semiconductor die on which the boost converter circuitry is implemented resulting from power dissipation;

comparing the final junction temperature value to a threshold junction temperature value; and if the final junction temperature value exceeds the threshold temperature change value, reducing the input current limit; and if the final junction temperature value is equal to or lower than the threshold junction temperature value, maintaining the input current limit at an existing level;

or wherein the controller is configured to control the input current limit of the boost converter circuitry based on the power dissipation value by:

determining a duration for which the boost converter circuitry is permitted to dissipate power at the power dissipation value; and controlling the input current limit of the boost converter circuitry based on the determined duration.

13. A system according to claim 12, wherein the controller is further configured to:

determine an input power value of the boost converter circuitry;

receive an efficiency value for the boost converter circuitry at the determined input power value; and determine, based on the efficiency value and the input power value, the power dissipation value for the boost converter circuitry.

14. A system according to claim 13, wherein determining the input power value of the boost converter circuitry comprises:

receiving an input current value and an input voltage value and determining the input power value based on the input current value and the input voltage value;

wherein the system further comprises current monitor circuitry configured to output a signal indicative of the input current value and voltage monitor circuitry configured to output a signal indicative of the input voltage value.

15. A system according to claim 12, wherein the controller is configured to determine the duration for which the boost converter is permitted to dissipate power at the power dissipation value by comparing the dissipated power value to a predefined power dissipation vs duration function.

16. A system according to claim 13, wherein the controller is configured to dynamically calculate the efficiency value during operation of the boost converter circuitry.

17. A system according to claim 13, wherein the controller is configured to determine the efficiency value based on a polynomial defining a relationship between an input power of the boost converter circuitry, a boost ratio of the boost converter circuitry and an efficiency of the boost converter circuitry; or wherein the controller is configured to determine the efficiency value based on a lookup table defining input power values, boost ratio values and corresponding efficiency values for the boost converter circuitry.

18. A system according to claim 12, wherein the controller is configured to control the input current limit of the boost converter circuitry to limit a die temperature increase or a rate of die temperature increase of a semiconductor die on which the boost converter circuitry is implemented.

19. An integrated circuit comprising a system according to claim 12.

20. A host device comprising a system according to claim 12, wherein the host device comprises a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console a VR or AR device, a mobile telephone, a portable audio player or other portable device.

21. A system for controlling an input current limit of boost converter circuitry, the system comprising a controller configured to:

receive a power dissipation value of the boost converter circuitry, wherein the power dissipation value is representative of power dissipated by the boost converter circuitry in operation of the boost converter circuitry;

determine a duration for which the boost converter circuitry is permitted to dissipate power at the power dissipation value; and control the input current limit of the boost converter circuitry based on the determined duration;

wherein the controller is further configured to:

determine an input power value of the boost converter circuitry;

receive an efficiency value for the boost converter circuitry at the determined input power value; and determine, based on the efficiency value and the input power value, the power dissipation value for the boost converter circuitry, wherein the controller is configured to determine the efficiency value based on a polynomial defining a relationship between an input power of the boost converter circuitry, a boost ratio of the boost converter circuitry and an efficiency of the boost converter circuitry or wherein the controller is configured to determine the efficiency value based on a lookup table defining input power values, boost ratio values and corresponding efficiency values for the boost converter circuitry.

* * * * *